United States Patent [19]
Gardner et al.

[11] Patent Number: 5,350,484
[45] Date of Patent: Sep. 27, 1994

[54] METHOD FOR THE ANISOTROPIC ETCHING OF METAL FILMS IN THE FABRICATION OF INTERCONNECTS

[75] Inventors: Donald S. Gardner, Mountain View; Xiao-Chun Mu, Saratoga; David B. Fraser, Danville, all of Calif.

[73] Assignee: Intel Corporation, Santa Clara, Calif.

[21] Appl. No.: 941,412

[22] Filed: Sep. 8, 1992

[51] Int. Cl.$^5$ .................................. H01L 21/00
[52] U.S. Cl. ................................ 156/628; 156/656; 156/664; 156/666; 437/225; 437/228
[58] Field of Search ............... 156/628, 666, 664, 656; 437/225, 228

[56] References Cited

U.S. PATENT DOCUMENTS

| | | | |
|---|---|---|---|
| 3,637,381 | 1/1972 | Hallman et al. | 156/628 X |
| 4,333,226 | 6/1982 | Abe et al. | 156/628 X |
| 4,352,716 | 10/1982 | Schaible et al. | 156/643 |
| 4,451,327 | 5/1984 | Nelson | 156/646 |
| 4,468,284 | 8/1984 | Nelson | 156/643 |
| 4,652,334 | 3/1987 | Jain et al. | 156/628 |
| 5,158,629 | 10/1992 | Zobbi | 156/628 |

FOREIGN PATENT DOCUMENTS

| | | | |
|---|---|---|---|
| 157234 | 12/1980 | Japan | 156/628 |
| 62737 | 5/1981 | Japan | 156/628 |
| 32428 | 2/1986 | Japan | 156/628 |
| 2159327A | 11/1985 | United Kingdom . | |

OTHER PUBLICATIONS

Chi, Kai-Ming, Farkas, Janos, Kodas, Tiovo, Kodas, and Hampden Smith, Mark. Chemical Engineering, Chemistry Department, University of New Mexico, Albuquerque, N.M. 87131. "Etching of Copper at High Rates via Generation of Volatile Copper Species" Sep., 1991.

Winters, Harold. "The Etching of Cu(100) with Cl$_2$" *Vacuum Science Technology* A3(3), pp. 786-790, May/-Jun. 1985.

Ohno, Kazuhide, Sato, Masaaki, Arita, Yoshinobu. "High Rate Reactive Ion Etching of Copper Films in SiCl$_4$, N$_2$, Cl$_2$ and NH$_3$ Mixture" *Conference on Solid State Devices and Materials, Sendai.* pp. 215-218, 1990.

Schwartz, G. C., and P. M. Schaible. "Reactive Ion Etching of Copper Films" *Electrochem. Society*, vol. 130:8 pp. 1777, 1983.

Ohno, K., Sato, M., and Yoshinobu Arita. "Reactive Ion Etching of Copper Films in SiCl$_4$ and N$_2$ Mixture" *Japanese Journal of Applied Physics* vol. 28:6, pp. 1070, Jun. 1989.

Ohno, K., Sato, M., and Yoshinobu Arita, "Extended Abstracts 28p-ZC-6" and an English Translation. *The Japan Society of Applied Physics, 38th Spring Meeting*, p. 500, Mar. 1991.

Hoshino, K., Nakamura, M., Yagi, H. Yano, H. and H. Tsuchikawa. "Extended Abstracts 1p-L-1" and an English Translation. The Japan Society of Applied Physics, 36th Spring Meeting, p. 570, Mar. 1989.

*Primary Examiner*—Thi Dang
*Attorney, Agent, or Firm*—Blakely, Sokoloff, Taylor & Zafman

[57] ABSTRACT

The present invention discloses a method for anisotropically etching metal interconnects in the fabrication of semiconductor devices, especially ULSI interconnects having high aspect ratios. A metal film is first deposited on the appropriate layer of a semiconductor substrate by techniques well-known in the art. A mask layer is deposited over the metal film with openings defined in the mask layer for patterning of the metal film. Ions are then introduced into an exposed region of the metal film to anisotropically form a converted layer of the metal film comprising compounds of the metal. The introduction of the ions into the metal film can be performed by conventional methods, such as through the use of a reactive ion etch system or an ion implantation system, or by any other method which anisotropically forms the metal compounds. The mask layer is then removed by conventional means to leave behind the metal film having a converted layer of metal compounds. Finally, the metal compounds are selectively removed by a suitable removal means chosen for its properties in removing the metal compounds without causing significant etching or degradation of the metal film itself.

52 Claims, 4 Drawing Sheets

METHOD FOR THE ANISOTROPIC ETCHING OF METAL FILMS IN THE FABRICATION OF INTERCONNECTS

BACKGROUND OF THE INVENTION

(1) Field of the Invention

The present invention relates to the field of fabricating semiconductor devices, and more particularly to anisotropically etching metal films formed on a semiconductor substrate of an integrated circuit for the fabrication of interconnects.

(2) Prior Art

In the manufacture of integrated circuits, it is often desired to etch certain areas of a metal film deposited on a semiconductor substrate to form metal interconnects between semiconductor devices. It is also desired to form metal interconnects having high aspect ratios for increasing the performance characteristics of the interconnects and for maximizing the device density of the integrated circuit. In the prior art, this has been accomplished through reactive ion etching of aluminum films wherein the ion-assisted etch process produces an anisotropic etch of the aluminum film to obtain the well-defined, high aspect ratios currently required in many of todays applications.

However, due to the increased speed and current density requirements for devices reaching submicron dimensions, the use of aluminum interconnects have become increasingly marginal. This is because the relatively high resistivity of aluminum as a metal, as seen in Table I shown below, hinders the performance and reliability of interconnects made from aluminum. This problem is particularly acute in current ultra-large scale integration (ULSI) devices which have relatively high aspect ratios of 2-3:1 or more. In addition, the present method for etching aluminum. interconnects also involves several drawbacks, including the formation of a native oxide on the aluminum film that is difficult to remove, the use of chlorine-based gasses that are either carcinogenic or highly toxic, and the formation of reactive compounds that degrade the pumping fluids used in the etch process.

TABLE I

RESISTIVITY OF METALS DEISIREABLE
FOR USE IN INTERCONNECTS
(in $\mu\Omega$-cm)

| Metal | Resistivity |
|---|---|
| Silver | 1.6 |
| Copper | 1.7 |
| Gold | 2.4 |
| Aluminum | 2.65 |

Due to the marginal performance and reliability of aluminum interconnects, some prior art methods have attempted to use copper instead of aluminum films since copper films provide a substantially lower resistivity and higher electromigration resistance. However, several problems in the formation of copper interconnects have rendered the prior art use of copper ineffective for interconnect applications. One of the problems with copper has been the difficulty in patterning the copper film. Although this problem was somewhat resolved through the use of selective deposition techniques, i.e. selective CVD or electrolysis plating, such techniques cannot be used in production because the presence of small defects or particulate contamination results in the loss of selectivity or the growth of large precipitates. For this reason, integrated circuit manufacturers have been trying to develop etching techniques for copper films that result in highly anisotropic and very selective etches.

Recently, it has been found that the anisotropic etching of copper using a chlorine-based gas chemistry in a reactive ion etch process can be achieved at submicron dimensions using elevated temperatures, i.e. around 250° to 300° C. Although the anisotropic etching of copper is a major break through, the high temperature requirement poses severe difficulties for plasma etch equipment manufacturers as well as process engineers in trying to develop a manufacturable etcher and process. This is because the volatile compound, copper chloride, produced in the high temperature etch process condenses on cold surfaces, thereby creating the problem of: copper chloride deposition in the vacuum lines, in the pumps and even on the unheated walls of the etch chamber. In addition, the high temperature requirement further prevents the use of a suitable masking material since most masks cannot withstand temperatures above approximately 120° C.

Although the prior art methods for etching interconnects have found some success with the anisotropic etching of aluminum and copper, it is widely recognized that a method which permits the anisotropic etching of other highly conductive metals such as silver, gold and molybdenum would also be of great importance and utility.

Accordingly, it is an object of the present invention to provide a method for anisotropically etching a variety of metal films to obtain metal interconnects having very high aspect ratios and minimal undercutting.

It is a further object of the present invention to provide a method for anisotropically etching highly conductive metal films to form ULSI interconnects having a very low resistivity and high electromigration resistance in order to obtain ULSI interconnects that meet the increased speed and current density requirements.

It is another object of the invention to provide a method for anisotropically etching silver, copper, gold, aluminum and molybdenum films at low temperatures for interconnect applications.

SUMMARY OF THE INVENTION

The present invention discloses a method for anisotropically etching metal interconnects, especially ULSI interconnects, having high aspect ratios. A metal film is first deposited on the appropriate layer of a semiconductor substrate by techniques well-known in the art. A mask layer is deposited over the metal film with openings defined in the mask layer for patterning of the metal film.

Ions are then driven into an exposed region of the metal film to anisotropically form a converted layer of the metal film comprising compounds of the metal. The introduction of the ions into the metal film can be performed by conventional methods, such as through the use of a reactive ion etch system or an ion implantation system, or by any other method which anisotropically forms the converted layer.

If a reactive ion etch system is utilized, the gasses used in the system are chosen in accordance with the metal compounds to be formed rather than a volatile species used for etching. If an ion implanter is utilized, an implant barrier may be formed beneath the metal film in order to prevent the ions from being implanted into the underlying layers, which barrier may also be used as a diffusion barrier. Furthermore, a thermal treatment step may be implemented after ion implantation so as to ensure that the ions have thoroughly diffused into the exposed region and have completely reacted with the metal atoms to form the metal compounds.

The mask layer is then removed by conventional means to leave behind the metal film having a converted layer of metal compounds. Finally, the metal compounds are selectively removed by a suitable removal means chosen for its properties in removing the metal compounds without causing significant etching or degradation of the metal film itself.

In this manner, metal interconnects can be formed without directly etching the metal film itself with a volatile species of the metal, thereby avoiding isotropic etching which results in undercutting and further avoiding the problematic high temperature requirement of the prior art methods. In addition, a wide variety of metals can now be utilized in the fabrication of interconnects, especially ULSI interconnects, so as to achieve interconnects having higher electromigration resistance and lower resistivity.

BRIEF DESCRIPTION OF THE DRAWINGS

The objects, features and advantages of the present invention will become apparent from the following detailed description of the preferred embodiment in which.

DETAILED DESCRIPTION OF THE INVENTION

Figure 1A:
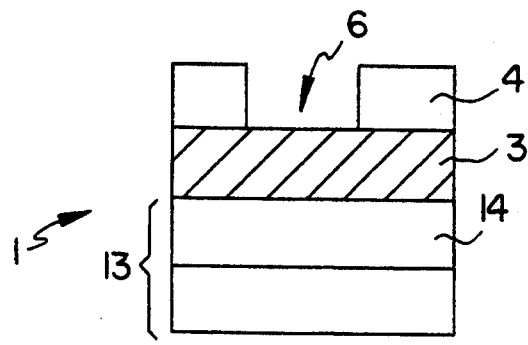
FIGS. 1A to 1D are cross-sectional views of a semiconductor substrate with a metal interconnect being formed thereon according to the general method of the present invention.

A method for anisotropically etching metal interconnects is described. In the following description, numerous details such as specific materials, structures, gas mixtures and etching parameters are set forth in order to provide a more complete understanding of the present invention. However, it is understood by those skilled in the art that the present invention can be practiced without these specific details. In other instances, well-known elements, devices, solvents and the like are not set forth in detail in order to avoid unnecessarily obscuring the present invention.

In the fabrication of metal interconnects according to the present invention, as shown in FIG. 1, a metal film 3 is deposited on a silicon dioxide layer 14 of a substrate 1 during the fabrication of a semiconductor device by techniques well-known in the art, such as CVD, sputter deposition or electrolysis deposition. Following the deposition of the metal film 3, a mask layer 4 is formed thereon for patterning the metal film 3 before the formation of the metal compounds to be etched. As shown in FIG. 1, openings are defined in the mask layer 4 using well-known photolithographic methods in order to define an exposed region 6 of the metal film 3 to be etched. The mask layer 4 may take the form of either a photoresist or a hard mask, with the hard mask formed from a material selected from the group of dielectric films, metal films, and tightly bonded metal oxide films. The selection of a suitable material for the mask layer 4 will depend upon the specific process utilized for converting the exposed region 6 and the removal means subsequently used to remove the converted layer 7 as will be described below. If a hard mask is selected for the mask layer 4, a photoresist layer 5 may be formed thereon for patterning of the hard mask.

Figure 1B:
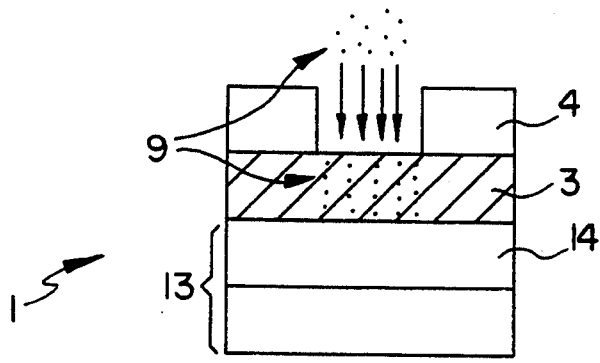
Figure 1C:
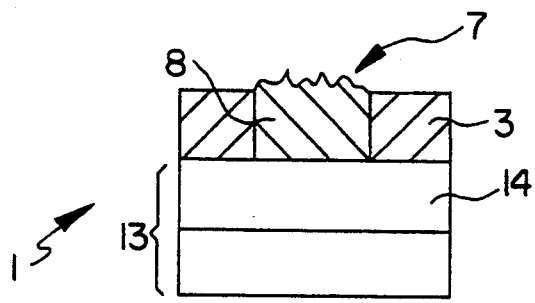
Figure 1D:
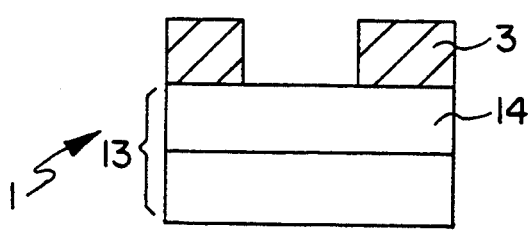

As shown in FIGS. 1A to 1C, the exposed region 6 is anisotropically converted into a converted layer 7 of metal compounds 8 of a type that can be removed without affecting the metal film 3 itself. This conversion step is performed by driving ions 9 into the exposed region 6 of the metal film 3 by techniques well-known in the art, including plasma etching and ion implantation, although other processes which anisotropically form the converted layer 7 may be used as well.

Figure 2A:
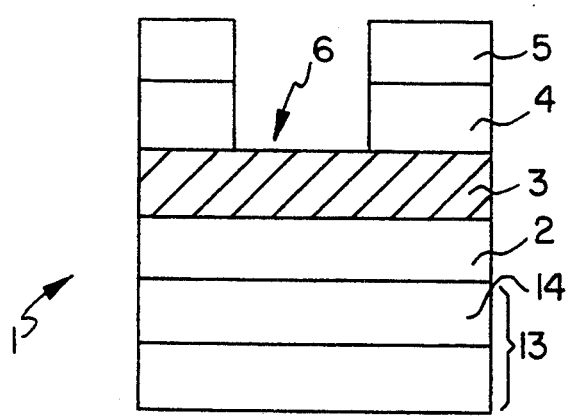
FIGS. 2A to 2B are cross-sectional views of a semiconductor substrate with a metal interconnect being formed thereon according to the preferred embodiment of the present invention.
Figure 2B:
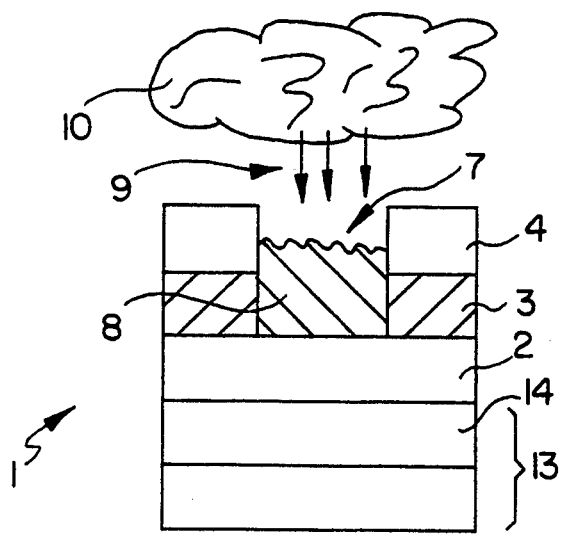
Figure 2C:
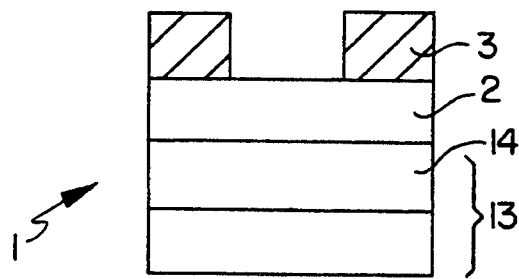

According to the preferred embodiment of the present invention, as shown in FIGS. 2A to 2C, the first technique used to anisotropically form the converted layer 7 is based on the same principles as plasma etching wherein an ionic plasma 10 in conjunction with an electric potential is used to drive the ions 9 into the exposed region 6 of the metal film 3. However, unlike the typical plasma etch process, the gasses chosen to form the plasma 10 in the present invention are selected in accordance with the metal compounds 8 to be formed rather than a volatile species used for etching. Hence, the same plasma etch system can be used to both form the compounds 8 within the exposed region and then subsequently remove the converted layer 7 from the metal film 3. In the preferred embodiment, an IPC Branson reactive ion etch system is used to form the converted layer 7. However, as will be obvious to one skilled in the art, the conversion process is not limited to this specific type of system. Any plasma etch system utilizing an electric potential for driving the ions 9 into the metal film 3 will achieve approximately the same results as long as the dosage of driven ions 9 is large enough to convert a substantial portion of the exposed region 6.

In an alternate embodiment of the present invention, as shown in FIGS. 3A to 3D, a second technique that can be utilized for conversion of the exposed region 6 is that of ion implantation where a beam of ions 12 is focused on the substrate 1 to directionally implant the ions 9 into the metal film 3. In the present invention, a high-current Extrion implanter manufactured by Varian Associates-Extrion is used for implanting the ions 9 into the metal film 3, although the particular ion implantation system used need not be limited to an implanter of this type. Similarly, a medium-current or a high-energy implanter can be used in the present invention depending upon the density of the metal film 3, the type of ions 9 to be implanted and the volume of the metal film 3 to be implanted.

An important consideration in the use of an ion implantation system is the possible use of a implant barrier 11 beneath the metal film 3 for protection of the underlying layers 13 from the ion implants 9. This implant barrier 11 may also be used as a diffusion barrier during the actual conversion of the exposed region 6 to prevent diffusion of the metal film 3 into the underlying layers 13. During ion implantation, the profile of the implants 9 exhibits an implant tail that may reach beyond the metal film 3 and into the underlying layers 13. In order to avoid charging and/or conversion of the underlying layers 13 into an unstable material, the implant barrier 11 is placed beneath the metal film 3 for absorption and neutralization of the ion implants 9. This implant barrier 11 should be formed from a material that is electrically and chemically stable with respect to the ion implants 9. For example, if oxygen ions were implanted into the metal film 3, a silicon oxide layer could be used to receive the implant tail so as to prevent any ionic contamination of the underlying layers 13.

Figure 3A:
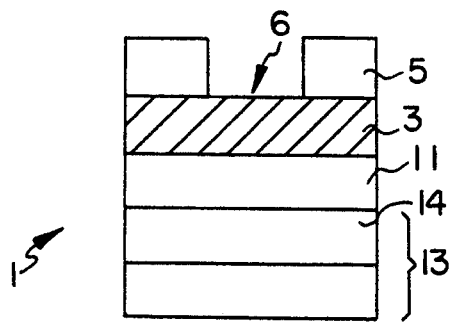
FIGS. 3A to 3D are cross-sectional views of a semiconductor substrate with a metal interconnect being formed thereon according to an alternate embodiment of the present invention.
Figure 3B:
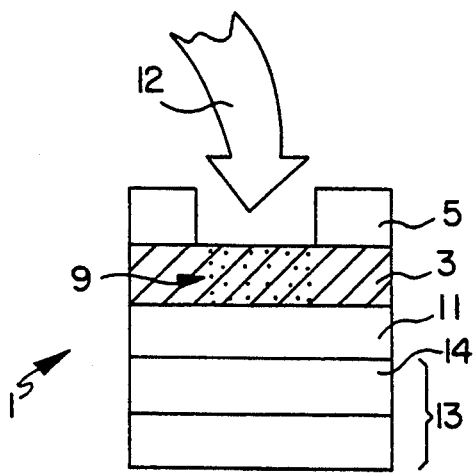
Figure 3C:
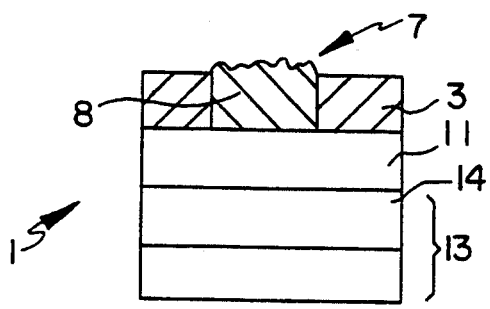
Figure 3D:
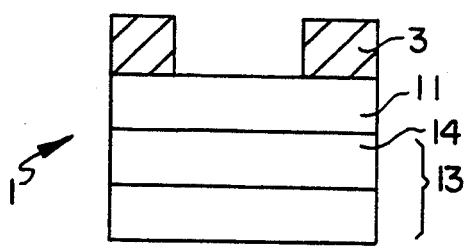

As shown in FIGS. 3B and 3C, after the exposed region 6 of the metal film 3 is thoroughly saturated with the ions 9, the mask layer 5 can then be removed by dissolution in a solvent or by other techniques well-known in the art. Following the removal of the mask layer 5, the substrate 1 may be thermally treated or annealed to assist in the reaction of the ions 9 with the metal atoms to form the metal compounds 8. Thermal treatment of the converted layer 7 is normally not required unless the ions 9 are driven into the metal film 3 at a relatively low temperature and the compounds 8 to be formed require more energy than that present. In addition, the mask layer 5 need not always be removed before applying thermal treatment (unless of course a photoresist layer is used) since, in some instances, it can be removed simultaneously with the converted layer 7 itself.

With respect to the use of a thermal treatment step in using the reactive ion etch technique shown in FIGS. 2A to 2C, the conversion of the exposed region 6 is performed at elevated temperatures in the plasma etch system so that the formation of the compounds 8 occurs almost simultaneously with the introduction of the ions 9 into the metal film 3. Hence, the preferred embodiment may be practiced without a thermal treatment step unless higher temperatures are required to form the specific compounds 8. With regard to the ion implantation process, ion implantation is sometimes performed at lower temperatures than the typical etch processes. Therefore, thermal treatment may also be used during or after implantation of the ions 9 in order to diffuse the implanted ions 9 throughout the exposed region 6 and ensure thorough conversion of the metal film 3. Obviously, the use and duration of the thermal treatment step is dependent upon several parameters, including the type of ions 9 to be implanted, the type of metal receiving the implant and the volume of metal to be converted.

The metal compounds 8 thus formed are then selectively removed through the use of a removal means which includes but is not limited to the application of a wet or dry solvent, evaporation and water solubilization. It is noted that in practice, it may be desireable to follow the initial removal of the converted layer 7, as described above, with a short dry etch in order to clean out any remaining residue left from the initial removal process.

As previously mentioned, the removal means must be chosen in accordance with the specific metal compounds 8 formed so that no substantial degradation of the metal film 3 or other structures of the substrate 1 results. If a liquid is used for the removal of the converted layer 7, the resulting etch is anisotropic rather than isotropic as would be the case in the prior art processes. This results from the fact that the converted layer 7 is formed by use of an anisotropic conversion process wherein the metal compounds 8 are selectively formed only within the exposed region 6 by directional driving of the ions 9 into the metal film 3.

In selecting the appropriate ions 9 and removal means to use in anisotropically etching a particular metal film 3, the general approach is to select ions 9 which form compounds 8 of the metal that can be removed from the metal film 3 without substantial etching or degradation of the metal film 3 itself. Hence, the first step is to determine what removal means cause significant etching or degradation of the metal film 3 (so that these can later be avoided). The next step is to define a group compounds of the metal that can be readily formed through either of the above-described conversion processes. The last step then involves selecting those compounds out of the group that can be readily removed by removal means other than those that significantly etch or degrade the metal.

For example, with reference to Table II shown below, if copper is chosen as the metal film 3, the solvents which must be avoided are $HNO_3$ and $H_2SO_4$ since they are known to significantly etch copper. With the use of a chemistry handbook, the copper compounds 8 that are readily etchable with etchants other than those noted above have been listed in column 2. The corresponding etchants for those compounds 8 are then listed in column 4. Therefore, with the copper compounds 8 having been selected, the type of ions 9 to be implanted to obtain those compounds then become apparent, as shown in column 1.

Figure 4A:
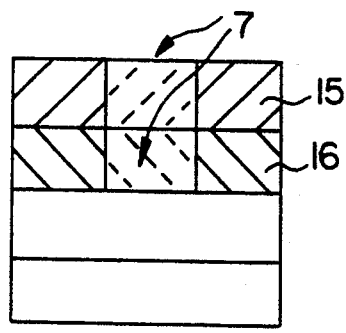
FIGS. 4A and 4B are cross-sectional views of a semiconductor substrate showing the formation of multiple-layer interconnects according to an alternate embodiment of the present invention.
Figure 4B:
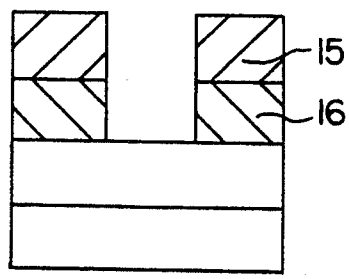
Figure 5A:
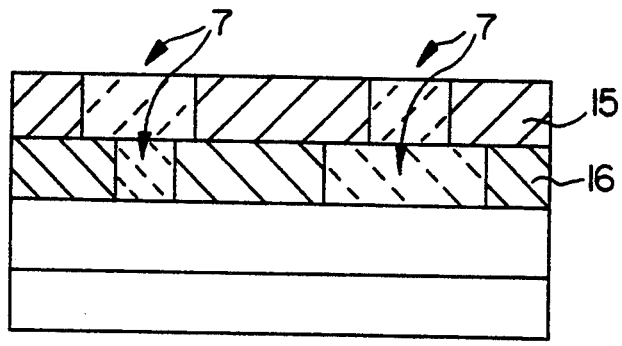
FIGS. 5A and 5B are cross-sectional views of a semiconductor substrate showing the formation of multiple-layer interconnects according to an alternate embodiment of the present invention.
Figure 5B:
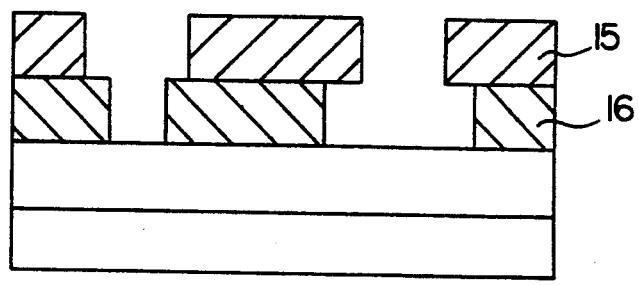

In addition to using the above-described processes to form single layer metal interconnects, the same processes may be used to form multi-layer interconnects having layers formed from different metal films 15 and 16 as shown in FIGS. 4 and 5. With reference to FIGS. 4A and 4B, the lower and upper layers 15 and 16 of such an interconnect may be converted in one step (FIG. 4A) and thereafter etched simultaneously with an appropriate removal means to form the simple bi-planar structure shown in FIG. 4B. Alternatively, the conversion (FIG. 5A) and/or removal of the converted layer 7 of each metal film 15 and 16 can be performed separately to form multi-layer interconnects having a plurality of shapes and dimensions as shown in FIG. 5B.

For purposes of explanation, an example of the present invention according to each of the above-described conversion processes will be described below.

EXAMPLE I

In the first case, shown in FIG. 2, a reactive ion etch, system is utilized to drive oxygen ions 9 into a copper film 3 to form copper oxide compounds 8. Because copper does not readily adhere to silicon dioxide, an adhesion layer 2 is first deposited on the silicon dioxide layer 14 of the substrate 1. The adhesion layer 2 may include but is not limited to Ta, Mo or TiN formed by sputtering deposition. The copper film 3 is then deposited on the adhesion layer 2 through sputtering deposition techniques well-known in the art. A hard mask layer 4 comprised of silicon nitride is next deposited on top of the copper film 3 followed by a photoresist layer 5 for patterning of the hard mask layer 4. The exposed portion of the hard mask 4 is then etched to reveal the exposed region of the metal film. In the example given, the use of the hard mask layer in combination with the photoresist layer is necessitated due to the fact that the photoresist 5 will etch away during the conversion step when exposed to the oxygen plasma created in the reactor chamber. Hence, the hard mask layer 4 is needed to prevent driving the oxygen ions 9 into unwanted areas of the copper film 3 as the photoresist layer 5 is etched.

Next, the conversion step is performed in an IPC Branson reactive ion system, wherein an oxygen gas is introduced into a pressure controlled system. Formation of the plasma 10, shown in FIG. 2B, takes place at an RF power of approximately 1000 watts and a pressure of 1.5 Torr. Once the plasma 10 is created, anisotropic formation of copper oxide occurs as a result of the electric field lines between the plasma 10 and the copper film 3 which drive the oxygen ions 9 into the copper perpendicular to the surface of the film 3.

After conversion of the exposed region 6 into the copper oxide compounds 8, the compounds 8 are removed from the metal film 3 using a wet clean of $(NH_4)Cl$. As mentioned above, this solvent is chosen for its ability to remove the copper oxide compounds 8 without any deleterious effect of the copper film 3 itself. Finally, the hard mask 4 is removed by techniques well-known in the art, such as by reactive ion etching with a chlorine-oxygen $(CHF_3/O_2)$ chemistry in order to obtain the final result shown in FIG. 2C.

An advantage of this new method over the prior art method of etching copper is that the ULSI interconnect is anisotropically formed in a conventional reactive ion etch system without the usual high temperature requirement. Therefore, the present invention avoids the formation of the undesired copper chloride compounds which eliminates the problem of copper chloride condensation and particle formation.

EXAMPLE II

In the second case, shown in FIG. 3, an ion implantation system is utilized to implant chlorine ions 9 into a copper film 3 to form copper chloride compounds 8. To prevent contamination of the layers 13 underlying the copper film 3 resulting from the implantation of chlorine ions 9 beyond the film 3, an implant barrier layer 11 of Molybdenum is first deposited on the substrate 1. After the copper film 3 is deposited as described above, a mask layer 5, comprising a photoresist in this case, is formed thereon and lithographically developed for patterning of the copper film 3. The conversion step is then performed using a high-current Extrion implanter with an accelleration potential of approximately 50–250 Kev to implant a large dose ($10^{18}/cm^2$) of the chlorine ions 9 into the copper film 3 at an angle of approximately 90° to the surface of the copper film 3.

If the implant is performed at a lower temperature than that required to react the chlorine ions 9 with the copper atoms, the substrate 1 is then heated to assist in the reaction. Once copper chloride compounds 8 are formed throughout the exposed region 6 of the metal film 3, the converted layer 7 can be removed by either evaporating the compounds 8 in a ligand ambient at a temperature of 100° C. or by using a wet clean comprised of $(NH_4)Cl$.

In addition to the foregoing examples, the following tables are provided to illustrate more clearly the various combinations of metals, ions, metal compounds and removal means that can be selected to form the metal interconnects as described above. However, it is noted that the combinations which may properly be used in the method of the present invention are not limited to the particular metals, ions, metal compounds and removal means listed below.

TABLE II

SILVER COMBINATIONS

| IONS | SILVER-BASED COMPOUNDS | SYMBOLS | ETCHANTS |
| --- | --- | --- | --- |
| Carbon | Silver acetylide | $Ag_2C_2$ | acid, alcohol |
| Arsenic/oxygen | Silver orthoarsenate | $Ag_3AsO_4$ | $NH_4OH$, acetic acid |
| Arsenic/oxygen | Silver orthoarsenite | $Ag_3AsO_3$ | acetic acid, $NH_4OH$ |
| Nitrogen | Silver azide | $AgN_3$ | $NH_4OH$ |
| Carbon/hydrogen/oxygen | Silver benzoate | $AgC_7H_5O_2$ | 0.017 alcohol |
| Boron/oxygen | Silver tetraborate | $Ag_2B_4O_7.2H_2O$ | $H_2O$; acid |
| Bromine/oxygen | Silver bromate | $AgBrO_3$ | $NH_4OH$ |
| Bromine | Silver bromide | Bromyrite; AgBr | NaCl sol; $NH_4OH$ |
| Carbon/oxygen | Silver carbonate | $Ag_2CO_3$ | $HN_4OH$, $Na_2S_2O_3$ |
| Chlorine/oxygen | Silver chlorate | $AgClO_3$ | alcohol |
| Chlorine/oxygen | Silver perchlorate | $AgClO_4$ | $H_2O$; alcohol; 101 toluene; 5.28 benzene |
| Chlorine | Silver chloride | Nat. cerargyrite, AgCl | $NH_4OH$, $Na_2S_2O_3$ |
| Chromium/oxygen | Silver chromate | $Ag_2CrO_4$ | $NH_4OH$ |
| Chromium/oxygen | Silver dichromate | $Ag_2Cr_2O_7$ | $H_2O$; acid, $NH_4OH$ |
| Carbon/hydrogen/oxygen | Silver citrate | $Ag_3C_6H_5O_7$ | $H_2O$; $NH_4OH$, $Na_2S_2O_3$ |
| Oxygen/carbon/nitrogen | Silver cyanate | AgOCN | $H_2O$; $NH_4OH$ |
| Carbon/nitrogen | Silver cyanide | AgCN | $NH_4OH$, $Na_2S_2O_3$ |
| Iron/carbon/nitrogen | Silver ferricyanide | $Ag_3Fe(CN)_6$ | $NH4OH$, $(NH_4)_2CO_3$ |
| Gallium/fluorine | Silver fluogallate | $Ag_3[GaF_6].10H_2O$ | $H_2O$ |
| Fluorine | Silver Fluoride | AgF | $NH_4OH$ |
| Fluorine | Silver difluoride | $AgF_2$ | $H_2O$ |
| Fluorine | Silver (di-)fluoride | $Ag_2F$ | $H_2O$ |
| Silicon/fluorine | Silver fluosilicate | $Ag_2SiF_6.4H_2O$ | $H_2O$ |
| Carbon/nitrogen/oxygen | Silver fulminate | $Ag_2C_2N_2O_2$ | $H_2O$; $NH_4OH$ |
| Iodine/oxygen | Silver iodate | $AgIO_3$ | $NH_4OH$, KI |
| Iodine/oxygen | Silver periodate | $AgIO_4$ | $H_2O$ |
| Iodine | Silver iodide ($\alpha$) | Nat. iodyrite, AgI | $Na2S2O3$, KI; $NH_4OH$ |
| Iodine/mercury | Silver iodomercurate ($\alpha$) | $Ag2HgI4$ | KI |
| Iodine/mercury | Silver iodomercurate ($\beta$) | $AG_2HgI_4$ | KI |
| Carbon/hydrogen/ | Silver laurate | $AgC_{12}H_{23}O_2$ | $0.007^{25}$ alcohol; $0.008^{15}$ ether |

TABLE II-continued

SILVER COMBINATIONS

| IONS | SILVER-BASED COMPOUNDS | SYMBOLS | ETCHANTS |
|---|---|---|---|
| oxygen | | | |
| Carbon/hydrogen/oxygen | Silver levunilate | $AgC_5H_7O_3$ | $H_2O$ |
| Manganese/oxygen | Silver permanganate | $AgMnO_4$ | alcohol |
| Carbon/hydrogen/oxygen | Silver myristate | $AgC_{14}H_{27}O_2$ | $0.006^{25}$ alcohol; $0.007^{15}$ ether |
| Nitrogen/oxygen | Silver nitrate | $AgNO_3$ | ether, glycerin |
| Nitrogen/oxygen | Silver nitrite | $AgNO_2$ | acetic acid, $NH_4OH$ |
| Platinum/nitrogen/oxygen | Silver nitroplatinite | $Ag_2[Pt(NO_2)_4]$ | $H_2O$ |
| Iron/nitrogen/oxygen/carbon | Silver nitroprusside | $Ag_2[FeNO(CN)_5]$ | $NH_4OH$ |
| Carbon/oxygen | Silver oxalate | $Ag_2C_2O_4$ | $NH_4OH$, acid |
| Oxygen | Silver oxide | $Ag_2O$ | acid, $NH_4OH$, alcohol |
| Oxygen | Silver peroxide | $Ag_2O_2$ (or $AgO$) | $NH_4OH$ |
| Carbon/hydrogen/oxygen | Silver palmitate | $AgC_{16}H_{31}O_2$ | $0.007^{15}$ ether; $0.006^{25}$ alcohol |
| Phosphorous/oxygen | Silver metaphosphate | $AgPO_3$ | $NH_4OH$ |
| Phosphorous/oxygen | Silver orthophosphate | $Ag_3PO_4$ | acid, $NH_4OH$, $NH_3$ |
| Phosphorous/oxygen | Silver pyrophosphate | $Ag_4P_2O_7$ | acid, $NH_4OH$, acetic acid |
| Carbon/hydrogen/oxygen | Silver salicylate | $AgC_7H_5O_3$ | $H_2O$, alcohol |
| Selenium | Silver selenide | $Ag_2Se$ | $NH_4OH$ |
| Carbon/hydrogen/oxygen | Silver stearate | $AgC_{18}H_{35}O_2$ | $0.006^{25}$ alcohol; $0.006^{25}$ ether |
| Sulfur/oxygen | Silver sulfate | $Ag_2SO_4$ | acid, $NH_4OH$ |
| Sulfur | Silver sulfide | Nat. argentite, $Ag_2S$ | acid |
| Sulfur/oxygen | Silver sulfite | $Ag_2SO_3$ | acid, $NH_4OH$ |
| Carbon/hydrogen/oxygen | Silver d-tartrate | $Ag_2C_4H_4O_6$ | acid, $NH_4OH$ |
| Helium/tellurium/oxygen | Silver orthotellurate, tetra-H | $Ag_2H_4TeO_6$ | $NH_4OH$ |
| Tellurium | Silver telluride | Nat. Hessite, $Ag_2Te$ | $NH_4OH$ |
| Tellurium/oxygen | Silver tellurite | $Ag_2TeO_3$ | $NH_3$ |
| Sulfur/carbon/oxygen | Silver thiocyanate | $AgSCN$ | $NH_4OH$ |
| Sulfur/oxygen | Silver thiosulfate | $AG_2S_2O_3$ | $H_2O$; $Na_2S_2O_3$, $NH_4OH$ |
| Tungsten/oxygen | Silver tungstate | $Ag_2WO_4$ | $NH_4OH$ |

TABLE III

| IONS | COPPER-BASED COMPOUNDS | SYMBOLS | ETCHANTS |
|---|---|---|---|
| Carbon | Copper acetylide | $CuC_2$ | $H_2O$, acid, KCN |
| Arsenic | Copper arsenide | $CU_5As_2$ | acid, $NH_4OH$ |
| Nitrogen | Copper azide | $CU(N_3)2$ | acid |
| Bromine | Copper bromide | $CuBr$ (or $Cu_2Br_2$) | $H_2O$, HBr, HCl, $NH_4OH$, acetone |
|  |  | $CuBr_2$ | $H_2O$, alcohol, acetone, $NH_3$, pyridine |
| Carbon/Oxygen | Copper carbonate | $Cu_2Co_3$ | acid, $NH_4OH$ |
| Chlorine/Oxygen | Copper perchlorate | $Cu(ClO_4)_2$ | $H_2O$ |
| Chlorine | Copper chloride | $CuCl$ (or $Cu_2Cl_2$); | HCL, $NH_4OH$, ether |
|  |  | $CuCl_2$ | alcohol, MeOH, acetone |
| Carbon/Nitrogen | Copper cyanide | $CuCn$; | HCl, KCN, $NH_4OH$ |
|  |  | $Cu(CN)_2$ | acid, alkali, KCN, pyridine |
| Fluorine | Copper fluoride | $CuF$ (or $Cu_2F_2$); | HCl, HF |
|  |  | $CuF_2$ | $H_2O$, mineral acid |
| Iodide | Copper iodine | Nat. marshite. $CuI$ (or $Cu_2I_2$) | HCl, KI, KCN, $NH_3$ |
| Oxygen/Nitrogen | Copper hydroxide | $Cu(OH)_2$ | acid, $NH_4OH$, KCN |
| Nitrogen | Copper nitride | $Cu_3N$ | $H_2O$, acid |
| Oxygen | Copper oxide | Nat. cuprite, $Cu_2O$ | HCl, $NH_4Cl$, $NH_4OH$ |
|  |  | Nat. tenorite, $CuO$ | acid, $NH_4Cl$, KCN, $NH_4F$ |
| Oxygen | Copper peroxide | $CuO_2.H_2O$ | acid |
| Oxygen | Copper suboxide | $Cu_4O$ | acid |
| Selenium | Copper selenide | $Cu_2Se$; | HCl |
|  |  | $CuSe$ | HCl, $NH_4OH$ |
| Sulfur/Oxygen | Copper sulfate | $Cu_2SO_4$ | HCl, $NH_3$ |
| Sulfur | Copper sulfide | Nat. chalcocite, $Cu_2S$; | $NH_4OH$ |
|  |  | Nat. covellite, $CuS$ | KCN, HCl |
| Tellurium | Copper telluride | $Cu_2Te$ | $Br + H_2O$ |
| Tellurium/Oxygen | Copper tellurite | $CuTeO_3$ | HCl |
| Sulfur/Carbon/Nitrogen | Copper thiocyanate | $CuSCN$; | $NH_4OH$, acetic acid |
|  |  | $Cu(SCN)_2$ | acid, $NH_4OH$ |

TABLE IV

GOLD COMBINATIONS

| IONS | GOLD-BASED COMPOUNDS | SYMBOLS | ETCHANTS |
|---|---|---|---|
| Bromine | Gold bromide | AuBr | acid; NaCN |
|  |  | Aubr$_3$ | H$_2$O; ether, alcohol |
| Chlorine | Gold chloride | AuCl | HCl, HBr, |
|  |  | AuCl$_3$ or Au$_2$Cl$_4$ | H$_2$O; alcohol, ether, NH$_3$ |
| Carbon/nitrogen | Gold cyanide | AuCN | NH$_4$OH |
|  |  | Cyanoauric acid. Au(CN)$_3$.3H$_2$O or HAu(CN)$_4$).3H$_2$O | H$_2$O; alcohol, ether |
| Iodine | Gold iodide | AuI | H$_2$O; KI |
|  |  | AUI$_3$ | H$_2$O; iodides |
| Hydrogen/oxygen/ nitrogen | Gold nitrate, hydrogen | Nitratoauric acid. AuH(NO$_3$)$_4$.3H$_2$O or H[Au(NO$_3$)$_4$].3H$_2$O | H$_2$O; HNO$_3$ |
| Oxygen | Gold oxide | Au$_2$O$_3$ | HCl, concentrated HNO$_3$, NaCN |
|  |  | Au$_2$O$_3$.xH$_2$O | HCl, NaCN, concentrated HNO$_3$ |
| Sulfur | Gold sulfide | Au$_2$S$_3$ | Na$_2$S |

TABLE V

ALUMINUM COMBINATIONS

| IONS | ALUMINUM-BASED COMPOUNDS | SYMBOLS | ETCHANTS |
|---|---|---|---|
| Carbon/hydrogen/ oxygen | Aluminum triacetate | Al(C$_2$H$_3$O$_2$)$_3$ | H$_2$O |
| Carbon/hydrogen/ oxygen | Aluminum acetylacetonate | Al(C$_5$H$_7$O$_2$)$_3$ | alcohol; ether, benzene |
| Arsenic/oxygen | Aluminum orthoarsenate | AlAsO$_4$.8H$_2$O | acid |
| Boron | Aluminum Boride | AlB$_{12}$ | HNO$_3$ |
| Bromine/oxygen | Aluminum bromate | Al(BrO$_3$)$_3$.9H$_2$O | H$_2$O; acid |
| Bromine | Aluminum bromide | AlBr$_3$ (or Al$_2$Br$_6$) | H$_2$O; alcohol, acetone, CS$_2$ |
| Bromine | Aluminum hexabromide hydrate | AlBr$_3$.6H$_2$O | H$_2$O; alcohol, acid, CS$_2$ |
| Bromine | Aluminum pentabromide decylhydrate | AlBr$_3$.15H$_2$O | H$_2$O; alcohol |
| Carbon/hydrogen/ oxygen | Aluminum tertbutoxide | Al(C$_4$H$_2$O)$_3$ | organic solvents |
| Carbon | Aluminum carbide | Al$_4$C$_3$ | H$_2$O; acid |
| Chlorine/oxygen | Aluminum chlorate | Al(ClO$_3$)$_3$.6H$_2$O | H$_2$O |
| Chlorine/oxygen | Aluminum perchlorate | Al(ClO$_4$)$_3$.6H$_2$O | H$_2$O |
| Chlorine | Aluminum chloride | AlCl$_3$ (or Al$_2$Cl$_6$) | H$_2$O; 100$^{12.5}$ alcohol; 0.072$^{25}$ chloroform; CCl$_4$, ether |
| Chlorine | Aluminum hexachloride hydrate | AlCl$_3$.6H$_2$O | H$_2$O; 50 alcohol; ether |
| Chlorine/nitrogen/ hydrogen | Aluminum hexammine | AlCl$_3$.6NH$_3$ | H$_2$O |
| Carbon/hydrogen/ oxygen | Aluminum diethylmalonate derivative | Al(C$_7$H$_{11}$O$_4$)$_3$ | organic solvents |
| Carbon/hydrogen/ oxygen | Aluminum ethoxide | Al(C$_2$H$_5$O)$_2$ | H$_2$O |
| Carbon/hydrogen/ oxygen | Aluminum α-ethylacetoacetate derivative | Al(C$_4$H$_9$O$_3$)$_3$ | H$_2$O; ligroin |
| Iron/carbon/nitrogen | Aluminum ferrocyanide | Al$_4$[Fe(CN)$_6$]$_3$.17H$_2$O | H$_2$O; acid |
| Fluorine | Aluminum fluoride | AlF$_3$ | H$_2$O |
|  |  | AlF$_3$.3½H$_2$O | H$_2$O; acetic acid |
| Fluorine | Aluminum monofluoride hydrate | Nat. fluelite. AlF$_3$.H$_2$O | H$_2$O |
| Oxygen/hydrogen | Aluminum hydroxide | Nat. boehmite, AlO(OH) | acid |
|  |  | Nat. diaspore. AlO(OH) | acid |
|  |  | Al(OH)$_3$ | acid |
| Iodine | Aluminum iodide | AlI$_3$ (or Al$_2$I$_6$) | H$_2$O; alcohol, ether, CS$_2$, NH$_3$ |
| Iodine | Aluminum hexaiodide hydrate | AlI$_3$.6H$_2$O | H$_2$O; alcohol, CS$_2$ |
| Carbon/hydrogen/ oxygen | Aluminum isopropoxide | Al(C$_3$H$_7$O)$_3$ | H$_2$O; alcohol, benzene, chloroform |
| Carbon/hydrogen/ oxygen | Aluminum lactate | Al(C$_3$H$_5$O$_3$)$_3$ | H$_2$O |
| Nitrogen/oxygen | Aluminum nitrate | Al(NO$_3$)$_3$.9H$_2$O | H$_2$O; 100 alcohol; acetone, HNO$_3$.acid |
| Nitrogen | Aluminum nitride | AlN | H$_2$O; acid, |
| Hydrogen/oxygen | Aluminum oleate (com'l) | Al($_{18}$H$_{33}$O$_2$)$_3$(?) | H$_2$O |
| Carbon/oxygen | Aluminum oxalate | Al$_2$(C$_2$O$_4$)$_3$.4H$_2$O | acid |
| Oxygen | Aluminum oxide | γ-Alumina. Al$_2$O$_3$ | acid |
| Oxygen | Aluminum trihydrate oxide | Nat. gibbsite, hydra-argilite. Al$_2$O$_3$.3H$_2$O | acid |
|  |  | Nat. bayerite. Al$_2$O$_3$.3H$_2$O | acid |
| Carbon/hydrogen/ | Aluminum monopalmitate | Al(OH)$_2$C$_{16}$H$_{31}$O$_2$ | hydrocarbon |

TABLE V-continued

ALUMINUM COMBINATIONS

| IONS | ALUMINUM-BASED COMPOUNDS | SYMBOLS | ETCHANTS |
|---|---|---|---|
| oxygen | (com'l) | | |
| Carbon/hydrogen/oxygen/sulfur | Aluminum 1-phenol-4-sulfonate | $Al(C_6H_5O_4S)_3$ | $H_2O$; alcohol, glycerin |
| Carbon/hydrogen/oxygen | Aluminum phenoxide | $Al(C_6H_5O)_3$ | $H_2O$; alcohol, ether, chloroform |
| Phosphorous/oxygen | Aluminum orthophosphate | $AlPO_4$ | acid, alcohol |
| Carbon/hydrogen/oxygen | Aluminum propoxide | $Al(C_3H_7O)_3$ | $H_2O$; alcohol |
| Selenium | Aluminum selenide | $Al_2Se_3$ | $H_2O$; acid |
| Oxygen/silicon | Aluminum silicate | Nat. sillimanite, andalusite, cyanite. $Al_2O_3.SiO_2$ | HF |
| Carbon/hydrogen/oxygen | Aluminum tritearate | $Al(C_{18}H_{35})_2)_3$ | alcohol, benzene, turpentine |
| Sulfur/oxygen | Aluminum sulphate | $Al_2(SO_4)_3$ | acid; alcohol |
| Sulfur | Aluminum sulfide | $Al_2S_3$ | $H_2O$; acid |

TABLE VI

MOLYBDENUM COMBINATIONS

| IONS | MOLYBDENUM-BASED COMPOUNDS | SYMBOLS | ETCHANTS |
|---|---|---|---|
| Bromine | Molybdenum dibromide | $MoBr_2$ (or $Mo_2Br_4$) | alkali |
| Bromine | Molybdenum tetrabromide | $MoBr_4$ | $H_2O$, alkali |
| Bromine | Molybdenum tribromide | $MoBr_3$ | alkali, NHe |
| Carbon | Molybdenum monocarbide | $MoC$ | HF, HCl |
| Carbon | Molybdenum dicarbide | $Mo_2C$ | HF, HCl |
| Carbon/oxygen | Molybdenum carbonyl | $Mo(CO)_6$ | benzene; ether |
| Chlorine | Molybdenum dichloride | $MoCl_2$ )or $Mo_2Cl_6$) | HCl, alkali, $NH_4OH$, alcohol, acetone |
| Chlorine | Molybdenum pentachloride | $MoCl_5$ | mineral acid, liquid, $NH_3$, $CCl_4$, chloroform; alcohol, ether |
| Chlorine | Molybdenum tetrachloride | $MoCl_4$ | concentrated mineral acid; alcohol, ether |
| Chlorine | Molybdenum trichloride | $MoCl_3$ | $H_2O$ |
| Fluorine | Molybdenum hexafluoride | $MoF_6$ | $H_2O$; $NH_4OH$, alkali |
| Oxygen/hydrogen | Molygdenum hydroxide | $Mo(OH)_3$ (or $Mo_2O_3.3H_2O$); | HCl; 30% $H_2O_2$ |
| | | $MoO(OH)_3$ (or $Mo_2O_5.3H_2O$); | acid, alkali, carbon |
| | | $MoO_3.2H_2O$ | $H_2O_2$, alkali, hydrogen; acid |
| Bromine/oxygen/hydrogen | Molybdenum hydroxytetradibromide | $Mo_3Br_4(OH)_2$ | alkali |
| Bromine/oxygen/hydrogen | Molybdenum hydroxytetradioctabromide hydrate | $Mo_3Br_4(OH)_2.8H_2O$ | HCl; alkali |
| Chlorine/oxygen/hydrogen | Molybdenum hydroxytetradichloride | $Mo_2Cl_4(OH)_2.2H_2O$ | concentrated acid |
| Iodine | Molybdenum di-iodide | $MoI_2$ | $H_2O$ |
| Oxygen/hydrogen | Molybdenum pentoxide | $Mo_2O_5$; | HCl |
| | | "Molybd. blue" $Mo_2O_5.xH_2O$ (variations in Mo and O) | $H_2O$; acid, MeOH |
| Oxygen | Molybdenum trioxide | Molybdic anhydride, Nat. Molybdite. $MoO_3$ | acid, alkaline sulfur, $NH_4OH$-; |
| Oxygen/bromine | Molybdenum dioxydibromide | $MoO_2Br_2$ | $H_2O$ |
| Oxygen/chlorine | Molybdenum oxytetrachloride | $MoOCl_4$ | $H_2O$ |
| Oxygen/chlorine | Molybdenum oxytrichloride | $MoOCl_3$ | $H_2O$ |
| Oxygen/chlorine | Molybdenum dioxydichloride | $MoO_2Cl_2$ | $H_2O$; alcohol, ether |
| Oxygen/chlorine/hydrogen | Molybdenum dioxydichloride hydrate | $MoO_2Cl_2.H_2O$ | $H_2O$; alcohol, acetone, ether |
| Oxygen/chlorine | Molybdenum trioxyhexachloride | $Mo_2O_3Cl_6$ | $H_2O$; ether |
| Oxygen/chlorine | Molybdenum trioxypentachloride | $Mo_2O_3Cl_5$ | $H_2O$ |
| Oxygen/hydrogen/chlorine | Molybdenum oxychloride acid | $MoO(OH)_2Cl_2$ | $H_2O$; alcohol, ether, acetone |
| Oxygen/fluorine | Molybdenum dioxydifluoride | $MoO_2F_2$ | $H_2O$; alcohol, MeOH |
| Oxygen/fluorine | Molybdenum oxytetrafluoride | $MoOF_4$ | $H_2O$; alcohol, ether, $CCl_4$ |
| Silicon | Molybdenum silicide | $MoSi_2$ | HF + $NHO_3$ |
| Silicon/oxygen/hydrogen | Molybdenunm pentasulfide | $Mo_2S_5.3H_2O$ | $NH_4OH$, alkali, sulfides |
| Sulfur | Molybdenum tetrasulfide | $MoS_4$ | alkaline |
| Sulfur | Molybdenum tridulfide | $MoS_3$ | $H_2O$, alkaline, sulfur, concentrated |

TABLE VI-continued

| | MOLYBDENUM COMBINATIONS | | |
|---|---|---|---|
| IONS | MOLYBDENUM-BASED COMPOUNDS | SYMBOLS | ETCHANTS |
| | | | KOH |

While the present invention has been described in conjunction with the preferred embodiment and several examples, it is evident that numerous alternatives, depictions, variations and uses will be apparent to those skilled in the art in light of the foregoing description. Specifically, the metal films 3 used in the present invention may comprise any of a variety of metals or a combination thereof, while the specific ions 9, metal compounds 8 and removal means are not limited to any specific type as they are to be selected in accordance with the metal compounds to be formed.

We claim:

1. In the fabrication of a semiconductor device, a method is provided for etching a metal film formed over a semiconductor substrate comprising the steps of:
   implanting ions into a region of the metal film to form a converted layer of metal compounds in the region; and
   selectively removing the converted layer by etching the metal compounds at low temperatures with an etchant chosen to prevent substantial etching of the metal film.

2. The method of claim 1, wherein the method further comprises the step of forming a mask on the metal film to define the preselected region of the metal film to be exposed to the ions.

3. The method of claim 2, wherein the mask comprises a hard mask selected from the group consisting of dielectric films, metal films and tightly bonded metal oxide films.

4. The method of claim 2, wherein the mask comprises a photoresist layer.

5. The method of claim 2, wherein the method further comprises the step of removing the mask after the converted layer is formed.

6. The method of claim 1, wherein the method further comprises the step of forming an implant barrier layer beneath the metal film to prevent the ions from penetrating into layers beneath the implant barrier layer.

7. The method of claim 6, wherein the implant barrier comprises a material that is electrically and chemically stable with respect to the ions implanted.

8. The method of claim 1, wherein the method further comprises the step of thermally treating the semiconductor substrate after the region is converted to assist in formation of the metal compounds.

9. The method of claim 1, wherein the metal film comprises copper, the ions comprise chlorine ions and the etchant is selected from the group consisting of HCl, NH$_4$OH, MeOH, ether, alcohol, acetone and water.

10. The method of claim 1, wherein the metal film comprises copper, the ions comprise oxygen ions and the etchant is selected from the group consisting of HCl, NH$_4$OH, NH$_4$Cl, KCN, NH$_4$F and acid.

11. The method of claim 1, wherein the metal film comprises copper, the ions comprise fluorine ions and the etchant is selected from the group consisting of HCl, HF, H$_2$O and mineral acid.

12. The method of claim 1, wherein the metal film comprises copper, the ions comprise bromine ions and the etchant is selected from the group consisting of HCl, NH$_4$OH, HBr, H$_2$O, NH$_3$, acetone, alcohol and pyridine.

13. The method of claim 1, wherein the metal film comprises copper, the ions comprise Iodine ions and the etchant is selected from the group consisting of HCl, KI, KCN and NH$_3$.

14. The method of claim 1, wherein the metal film comprises molybdenum, the ions comprise oxygen ions and the etchant is selected from the group consisting of H$_2$O, NH$_4$OH, acid, and a solution comprising alkaline sulfur.

15. The method of claim 1, wherein the metal film comprises silver, the ions comprise fluorine ions and the etchant is selected from the group consisting of H$_2$O and NH$_4$OH.

16. The method of claim 1, wherein the metal film comprises silver, the ions comprise oxygen ions and the etchant is selected from the group consisting of NH$_4$OH, acid and alcohol.

17. In the fabrication of a semiconductor device, a method is provided for etching a metal film formed over a semiconductor substrate comprising the steps of:
   forming an implant barrier layer on the semiconductor substrate;
   forming the metal film on the implant barrier layer;
   implanting ions into a region of the metal film to form a converted layer of metal compounds within the region, the implant barrier layer preventing the ions from penetrating into layers beneath the implant barrier layer; and
   selectively removing the converted layer without substantial etching of the metal film.

18. The method of claim 17, wherein the step of removing the converted layer is performed by applying an etchant to etch the metal compounds.

19. The method of claim 18, wherein the metal film comprises copper, the ions comprise chlorine ions and the etchant is selected from the group consisting of HCl, NH$_4$OH, MeOH, ether, alcohol, acetone and water.

20. The method of claim 18, wherein the metal film comprises copper, the ions comprise oxygen ions and the etchant is selected from the group consisting of HCl, NH$_4$OH, NH$_4$Cl, KCN, NH$_4$F and acid.

21. The method of claim 18, wherein the metal film comprises copper, the ions comprise fluorine ions and the etchant is selected from the group consisting of HCl, HF, H$_2$O and mineral acid.

22. The method of claim 18, wherein the metal film comprises copper, the ions comprise bromine ions and the etchant is selected from the group consisting of HCl, NH$_4$OH, HBr, H$_2$O, NH$_3$, acetone, alcohol and pyridine.

23. The method of claim 18, wherein the metal film comprises copper, the ions comprise iodine ions and the etchant is selected from the group consisting of HCl, KI, KCN and NH$_3$.

24. The method of claim 18, wherein the metal film comprises molybdenum, the ions comprise oxygen ions and the etchant is selected from the group consisting of $H_2O$, $NH_4OH$, acid and a solution comprising alkaline sulfur.

25. The method of claim 18, wherein the metal film comprises silver, the ions comprise fluorine ions and the etchant is selected from the group consisting of $H_2O$ and $NH_4OH$.

26. The method of claim 18, wherein the metal film comprises silver, the ions comprise oxygen ions and the etchant is selected from the group consisting of $NH_4OH$, acid and alcohol.

27. The method of claim 17, wherein the implant barrier comprises a material that is electrically and chemically stable with respect to the ions implanted.

28. The method of claim 17, wherein the method further comprises the step of thermally treating the semiconductor substrate after the ions are implanted into the region to assist in the formation of the metal compounds.

29. The method of claim 17, wherein the metal film comprises copper, the ions comprise chlorine ions and the step of removing the metal compounds is performed by evaporating the metal compounds in a ligand ambient.

30. The method of claim 17, wherein the metal film comprises copper, the plasma comprises bromine ions and the step of removing the metal compounds is performed by evaporating the metal compounds in a ligand ambient.

31. The method of claim 17, wherein the method further comprises the step of forming a mask on the metal film to define the preselected region of the metal film to be exposed to the ions.

32. In the fabrication of a semiconductor device, a method is provided for etching a metal film formed on a semiconductor substrate comprising the steps of:
 exposing the semiconductor substrate to a plasma comprising ions under an electric potential to reactively form metal compounds within a region of the metal film; and
 selectively removing the converted layer without substantial etching of the metal film.

33. The method of claim 32, wherein the step of exposing the semiconductor substrate to a plasma is performed in a reactive ion etch system.

34. The method of claim 33, wherein the method further comprises the step of heating the semiconductor substrate to at least 200° Celsius during the exposure of the semiconductor substrate to the plasma.

35. The method of claim 33, wherein the metal film comprises copper, the plasma comprises chlorine ions and the step of removing the metal compounds is performed by evaporating the metal compounds in a ligand ambient.

36. The method of claim 33, wherein the metal comprises copper, the plasma comprises bromine ions and the step of removing the metal compounds is performed by evaporating the metal compounds in a ligand ambient.

37. The method of claim 33, wherein the step of removing the converted layer is performed by applying an etchant to etch the metal compounds.

38. The method of claim 33, wherein the metal film comprises copper, the ions comprise chlorine ions and the etchant is selected from the group consisting of HCl, $NH_4OH$, MeOH, ether, alcohol, acetone and water.

39. The method of claim 33, wherein the metal film comprises copper, the ions comprise oxygen ions and the etchant is selected from the group consisting of HCl, $NH_4OH$, $NH_4Cl$, KCN, $NH_4F$ and acid.

40. The method of claim 33, wherein the metal film comprises copper, the ions comprise fluorine ions and the etchant is selected from the group consisting of HCl, HF, $H_2O$ and mineral acid.

41. The method of claim 33, wherein the metal film comprises copper, the ions comprise bromine ions and the etchant is selected from the group consisting of HCl, $NH_4OH$, HBr, $H_2O$, $NH_3$, acetone, alcohol and pyridine.

42. The method of claim 33, wherein the metal film comprises copper, the ions comprise iodine ions and the etchant is selected from the group consisting of HCl, KI, KCN and $NH_3$.

43. The method of claim 33, wherein the metal film comprises molybdenum, the ions comprise oxygen ions and the etchant is selected from the group consisting of $H_2O$, $NH_4OH$, acid, and a solution comprising alkaline sulfur.

44. The method of claim 33, wherein the metal film comprises silver, the ions comprise fluorine ions and the etchant is selected from the group consisting of $H_2O$ and $NH_4OH$.

45. The method of claim 33, wherein the metal film comprises silver, the ions comprise oxygen ions and the etchant is selected from the group consisting of $NH_4OH$, acid and alcohol.

46. The method of claim 32, wherein the method further comprises the step of forming a mask on the metal film to define the preselected region of the metal film to be exposed to the ions.

47. The method of claim 46, wherein the mask comprises a hard mask selected from the group consisting of dielectric films, metal films and tightly bonded metal oxide films.

48. The method of claim 46, wherein the mask comprises a photoresist layer.

49. The method of claim 46, wherein the method further comprises the step of removing the mask after the converted layer is formed.

50. The method of claim 46, wherein the mask comprises a hard mask selected from the group consisting of dielectric films, metal films and tightly bonded metal oxide films.

51. The method of claim 46, wherein the mask comprises a photoresist layer.

52. The method of claim 46, wherein the method further comprises the step of removing the mask after the converted layer is formed.

* * * * *

UNITED STATES PATENT AND TRADEMARK OFFICE
CERTIFICATE OF CORRECTION

PATENT NO. : 5,350,484
DATED : September 27, 1994
INVENTOR(S) : Donald S. Gardner, Xiao-Chun Mu, David B. Fraser It is certified that error appears in the above-indentified patent and that said Letters Patent is hereby corrected as shown below:

Column 1; Line 37; Delete "."

Column 2; Line 16; Delete ":"

Column 3; Line 33; Delete "B"; Insert in place thereof --C--

Column 11; Table V; Row 28; Delete "AIN"; Insert in place thereof --AlN--

Column 13; Table V; Row 7; Delete "Al(C$_{18}$H$_{35}$)2)3"; Insert in place thereof ---Al(C$_{18}$H$_{35}$O$_2$)3--.

Column 13; Table VI; Row 3; Delete "NHe"; insert in place thereof -- NH3 --.

Column 13; Table VI; Row 7; Delete "MoCl$_2$ )or Mo$_2$Cl$_6$)"; Insert in place thereof --MoCl$_2$ (or Mo$_2$Cl$_6$)--

Signed and Sealed this

Twenty-first Day of November, 1995

Attest:

BRUCE LEHMAN

*Attesting Officer*  *Commissioner of Patents and Trademarks*